(12) United States Patent
Coutts et al.

(10) Patent No.: US 9,585,242 B2
(45) Date of Patent: Feb. 28, 2017

(54) PLANE CONNECTED EMBEDDED SUBSTRATE CAPACITOR

(71) Applicant: QUALCOMM Incorporated, San Diego, CA (US)

(72) Inventors: Ryan Michael Coutts, Carlsbad, CA (US); Yuancheng Christopher Pan, Saratoga, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/185,505

(22) Filed: Feb. 20, 2014

(65) Prior Publication Data

US 2015/0237714 A1    Aug. 20, 2015

(51) Int. Cl.
| | |
|---|---|
| H05K 1/02 | (2006.01) |
| H05K 1/18 | (2006.01) |
| H01L 23/498 | (2006.01) |
| H05K 3/46 | (2006.01) |
| H01L 23/64 | (2006.01) |
| H01L 23/00 | (2006.01) |

(52) U.S. Cl.
CPC ..... *H05K 1/0231* (2013.01); *H01L 23/49822* (2013.01); *H05K 1/185* (2013.01); *H01L 23/642* (2013.01); *H01L 24/13* (2013.01); *H01L 24/16* (2013.01); *H01L 2224/131* (2013.01); *H01L 2224/13147* (2013.01); *H01L 2224/16227* (2013.01); *H01L 2924/15311* (2013.01); *H05K 3/4697* (2013.01); *H05K 2201/093* (2013.01); *H05K 2201/10015* (2013.01)

(58) Field of Classification Search
CPC . H05K 1/0231; H05K 1/185; H01L 23/49822
See application file for complete search history.

(56) References Cited

U.S. PATENT DOCUMENTS

| 6,740,411 B2 * | 5/2004 | Kojima et al. ............ 428/413 |
| 8,289,725 B2 | 10/2012 | Fan |
| 2006/0118931 A1 | 6/2006 | Ho et al. |

FOREIGN PATENT DOCUMENTS

| JP | 2005302854 A | 10/2005 |
| JP | 2012151154 A | 8/2012 |

* cited by examiner

*Primary Examiner* — Long Pham
(74) *Attorney, Agent, or Firm* — Muncy, Geissler, Olds & Lowe, P.C.

(57) ABSTRACT

A package substrate is provided that includes a substrate and a capacitor. The substrate comprises a cavity penetrating a core layer and metal layers of the substrate. The capacitor comprises electrode pads and is disposed in the cavity. One of the metal layers of the substrate includes a discontinuous metal plane, and the electrode pads directly contact the discontinuous metal plane.

20 Claims, 8 Drawing Sheets

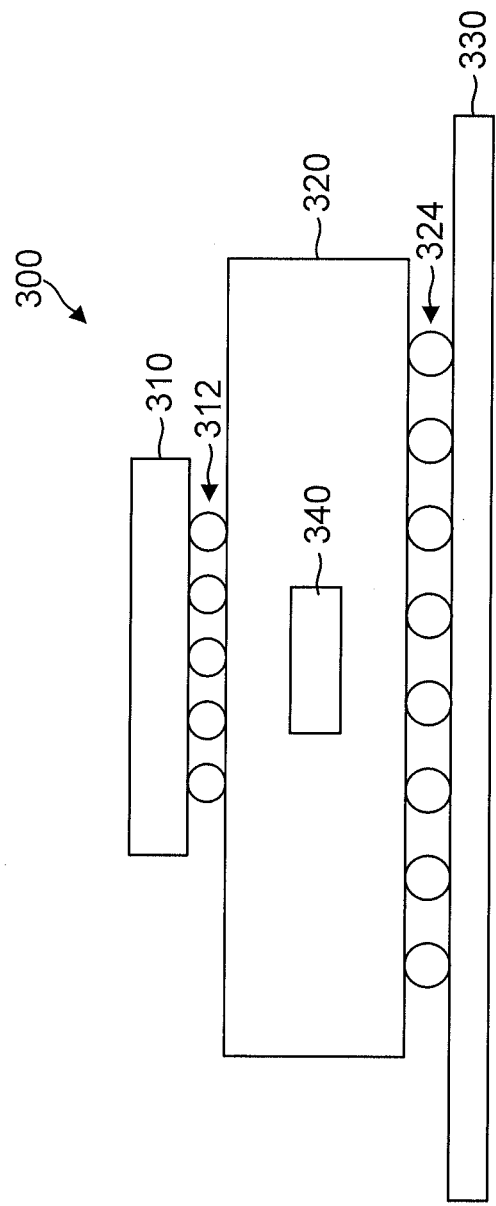

PLANE CONNECTED EMBEDDED SUBSTRATE CAPACITOR

TECHNICAL FIELD

This application relates to embedded capacitors for an integrated circuit package, and more particularly, to a reduced mounting inductance of the capacitors and the package.

BACKGROUND

A digital circuit such as a microprocessor includes numerous transistors that alternate between dormant and switching states. Such digital circuits thus make abrupt current demands when large numbers of transistors switch states. But power supplies cannot react so quickly such that the voltage on the power supply lead or interconnect to the die including the digital system may dip unacceptably. To smooth the power demands, it is conventional to load the power supply lead to the die with decoupling capacitors. The decoupling capacitors store charge that may be released during times of high power demand so as to stabilize the power supply voltage from the external power supply.

It is conventional to mount decoupling capacitors onto a circuit board but such a mounting location increases the circuit board footprint. Moreover, it desirable to place the decoupling capacitor as close as possible to the die it services. Mounting the decoupling capacitor further away from the die onto the circuit board increases the parasitic resistance and inductance undesirably. Thus, it is conventional to surface mount decoupling capacitors onto the package substrate for the die but such a mounting location increases the package substrate footprint. To increase density, it is also conventional to embed capacitors such as decoupling capacitors into the package substrate. The die may be mounted to the package substrate directly over the embedded decoupling capacitor, which advantageously reduces the parasitic resistance and inductance.

Embedded package substrate (EPS) capacitors are typically formed by cutting a hole out of a substrate, placing the capacitor in the core layer, filling the hole with material to hold the capacitor, and then coupling the capacitor to other components using through vias. FIG. 1 illustrates a package substrate 100 with an EPS capacitor 150 according to the prior art. The substrate 100 includes a core layer 102, a cavity 104, and a plurality of metal layers such as an M1 metal layer 106, an M2 metal layer 108, an M3 metal layer 110, and an M4 metal layer 112. EPS capacitor 150, which may comprise a multi-layer ceramic capacitor (MLCC), is disposed in the cavity 104 and has electrodes 152, 154 disposed at its left and right ends, respectively. The remainder of cavity 104 may then be filled with resin 114 to secure capacitor 150 within substrate 100. The electrodes 152, 154 electrically connect with M1 metal layer 106 through a plurality of vias 116. Similarly, pads 152, 154 couple to M4 metal layer 112 through a plurality of vias 118.

Despite the reduced package footprint enabled by EPS capacitor 150 and its relatively short coupling distance to the associated die (not illustrated), there are a number of problems with such a conventional EPS approach. In particular, vias 116 as well as vias 118 are limited to the footprints for electrodes 152 and 154. The footprint (or surface area) of electrodes 152 and 154 thus limits the number of vias 116 and 118 that may be accommodated in package substrate 100. As the number of vias decrease, the current through each via increases and the resistance to the increased passage of current increases. Similarly, as current increases, the strength of the magnetic field increases and inductance associated with the current increases. The resulting parasitic inductance and resistance for the coupling to the associated die is thus undesirably high.

Accordingly, there is a need in the art for package substrates with embedded capacitors having reduced parasitic inductance and parasitic resistance.

SUMMARY

To provide an embedded capacitor with improved or reduced mounting inductance, a package substrate is disclosed that includes an embedded capacitor having electrodes coupled to a metal layer. The package substrate includes a core layer having a cavity that receives the embedded capacitor. During formation of the cavity, a portion of the metal layer is removed to expose the cavity. At least one of the metal layers is a discontinuous metal plane, and in one embodiment, the metal layer is reconstructed or rebuilt to form a reconstructed discontinuous metal plane. A "discontinuous metal plane" as used herein, refers to a plane of metal that is discontinuous at at least one location. The discontinuity may be filled with air, or another type of material which is the same as that of the metal plane or different than that of the metal plane. In other words, the discontinuous metal plane may be re-constructed such that portions of the plane are rebuilt. Such a structure is a "reconstructed discontinuous metal plane." Portions of the metal layer that were removed to form the cavity are rebuilt or restored. Disposed within the cavity is a capacitor having electrode pads. The electrode pads directly contact the discontinuous metal plane. In various embodiments, a plurality of vias electrically connect the discontinuous metal plane to a first metal layer of the substrate. In an embodiment, the plurality of vias are configured to reduce loop inductance.

BRIEF DESCRIPTION OF THE DRAWINGS

FIG. 3 is an integrated circuit package in which a capacitor is embedded in the package substrate.

Embodiments of the present disclosure and their advantages are best understood by referring to the detailed description that follows. It should be appreciated that like reference numerals are used to identify like elements illustrated in one or more of the figures.

DETAILED DESCRIPTION

To meet the need in the art for embedded capacitors with reduced mounting inductance, a package substrate is provided that includes an embedded capacitor that is in direct contact with a discontinuous metal plane. The capacitor is connected to the substrate in a different way to improve mounting inductance. The package substrate includes a substrate having a core layer and metal layers. A cavity is formed through the core layer and metal layers, which removes a portion of the metal layers. A capacitor is inserted into the cavity. At least one of the metal layers is a discontinuous metal plane. The metal layer is discontinuous because a portion of the metal layer is removed to form the cavity. In one embodiment, the metal layer is a reconstructed discontinuous metal plane. Rather than connect the electrode pads of the capacitor to vias that connect to a first metal layer of the substrate, the electrode pads directly contact the discontinuous metal plane. In one embodiment, this direct contact between the electrode pads and the discontinuous metal plane improves mounting inductance. Vias may be used to electrically connect the discontinuous metal plane to the first metal layer. The vias are a means for coupling the capacitor to the first metal layer.

Overview

Figure 1:
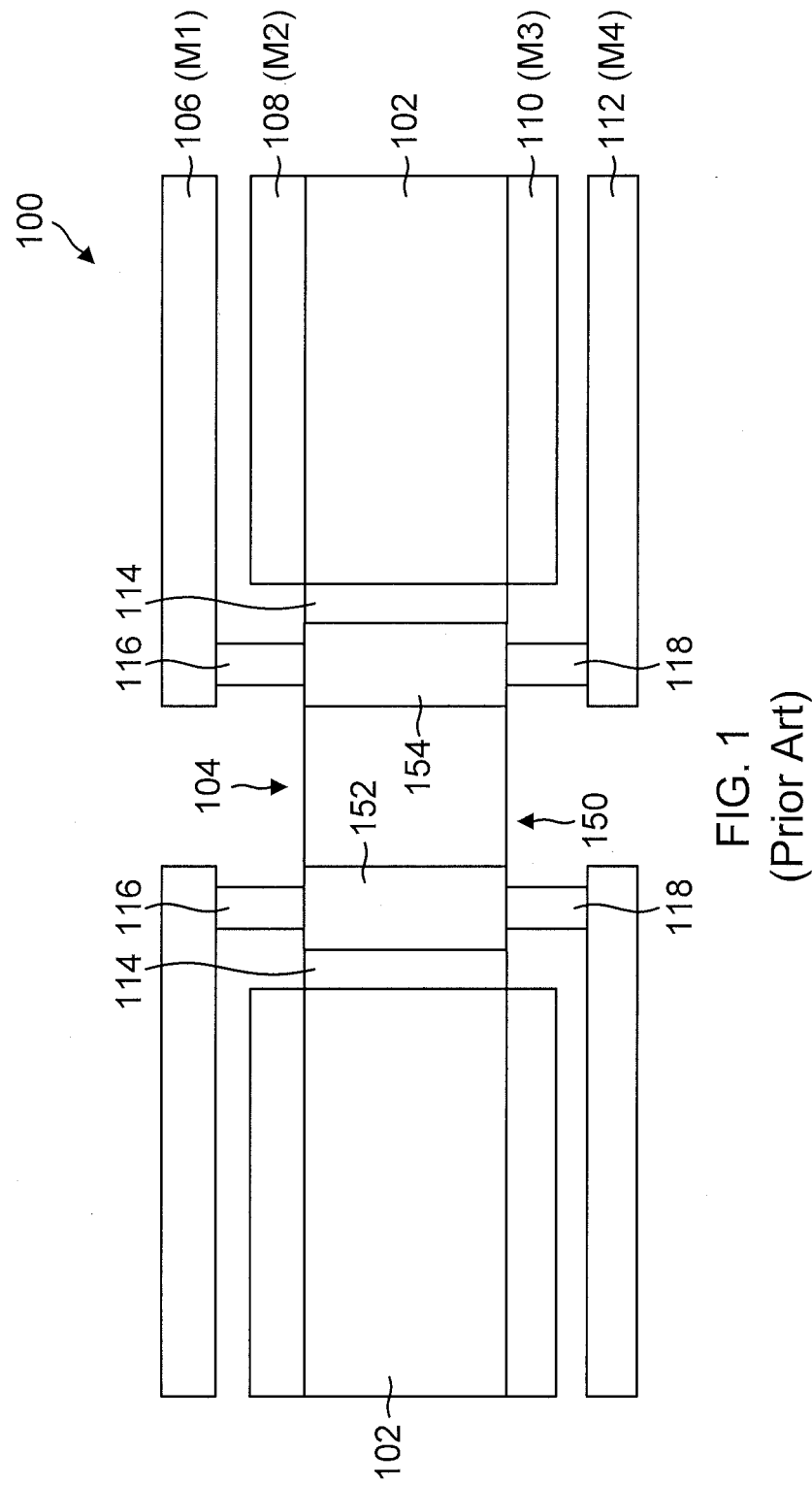
FIG. 1 is a cross-sectional view of a package substrate with an embedded package substrate (EPS) capacitor in accordance with the prior art.
Figure 2A:
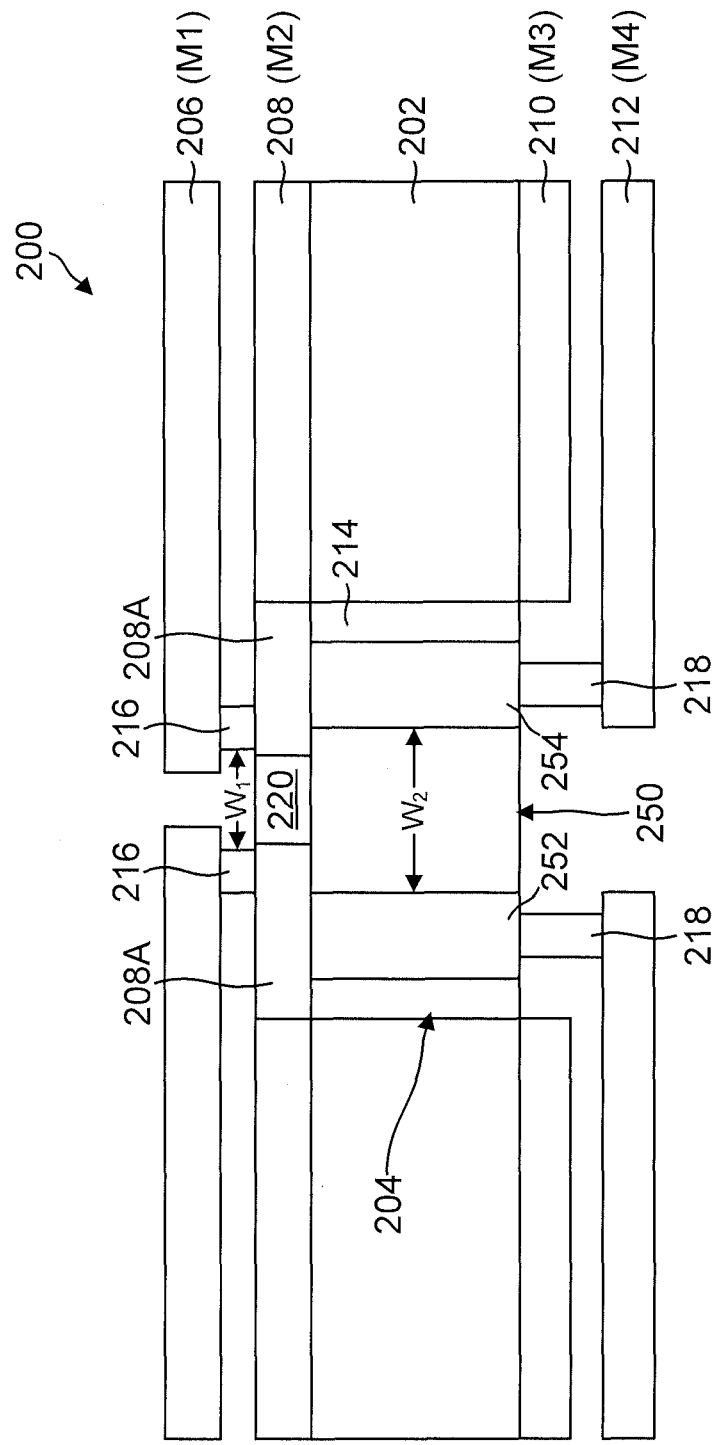
FIG. 2A is a cross-sectional view of a package substrate with an EPS capacitor in accordance with an embodiment of the present disclosure.

FIG. 2A shows an example package substrate 200 comprising a capacitor 250. The substrate 200 is provided with a core layer 202, a cavity 204, and a plurality of metal layers such as an M1 metal layer 206, an M2 metal layer 208, an M3 metal layer 210, and an M4 metal layer 212. Here, four metal layers are illustrated, but it should be understood that there may be more or less metal layers. The metal layers may comprise copper, nickel, or other suitable metals for conducting such as silver or gold. The core 202 may comprise, for example, an organic material. The M2 metal layer 208 covers a first surface of the core layer 202, and the M3 metal layer 210 covers a second surface of the core layer 202.

The capacitor 250 is disposed in the cavity 204, wherein the cavity 204 is formed in the metal layers including M2 metal layer 208. In other words, after the formation of the cavity 204 in the metal layers, M2 metal layer 208 becomes a discontinuous metal plane because a portion of the M2 metal layer 208 is removed to form the cavity 204. The capacitor 250 has first and second electrode pads 252, 254 disposed such that the first and second electrode pads 252, 254 are perpendicular to the M2 metal layer 208. The cavity 204 is filled with a resin 214 to hold the capacitor 250 in the cavity 204. The first and second electrode pads 252, 254 are directly coupled to reconstructed M2 metal layer portions 208a and electrically connected to the M1 metal layer 206 through vias 216. The M2 metal layer 208 is a metal plane that can be, for example, a power plane and/or a ground plane. As shown, between the reconstructed M2 metal layer portions 208a, is dielectric layer 220. Dielectric layer 220 functions to separate and electrically isolate the first and second electrode pads 252, 254. The first and second electrode pads 252, 254 are electrically connected to the M4 metal layer 212 through the vias 218. Although not illustrated, the first and second electrode pads 252, 254 may be directly coupled to reconstructed M3 metal layer portions (not shown) and electrically connected to the M4 metal layer 212 through the vias 218.

In one exemplary embodiment, the M2 metal layer 208 is a reconstructed metal plane. That is, the portions of the M2 metal layer 208 that were removed to form cavity 204 are rebuilt or restored. The M2 metal layer 208 now includes reconstructed M2 metal layer portions 208a that cover one surface of the capacitor 250. In one embodiment of the present disclosure, the capacitor 250 is in direct contact with the M2 metal layer portions 208a. The M2 metal layer 208 is a discontinuous metal plane, meaning that the plane is discontinuous at at least one location.

This discontinuous metal plane provides the ability to add more vias and flexibility regarding where to add those vias. In traditional implementations, the vias had to be positioned directly on the first and second electrode pads, which limited the number of vias and the area where vias could be placed. With the increased area provided by the discontinuous metal plane, more vias can be formed, and placement of the vias is not limited to the first and second electrode pads.

The increased number of vias decreases the inductance associated with the via because current is now allowed to flow through more channels. The current through each via is less, resulting in a weaker magnetic field around the via, which in turn, results in less inductance.

In contrast to the prior art, in an embodiment of the present disclosure, current may travel through the first and second electrodes 252 and 254 and travel to the M2 metal layer 208. In other words, the current traverses the M2 metal layer 208 laterally, which allows the vias to be formed onto the M2 metal layer 208, rather than onto the first and second electrodes 252 and 254. Because the vias 216 do not need to be placed directly on the first and second electrode paths 252 and 254, the vias 216 may be spaced closer together. In other words, the width $W_1$ between the vias 216 is less than the width $W_2$ between the electrode pads 252, 254. This arrangement leads to smaller loop inductance. By reducing the space between the vias 216, the loop through which current travels is made smaller. When the vias are spaced apart by the width W2, the current travels through a loop that includes the width W2. This is a larger loop than the one that encompasses the width W1. A larger loop creates a stronger magnetic field, and results in a greater inductance than a smaller loop. In other words, the greater the size of the loop, the greater the inductance.

Moreover, more vias that connect the capacitor 250 to the M1 metal layer 206 can now be added. The area where vias can be used to couple the capacitor to the M1 metal layer 206 is increased because the vias are not limited to right above the electrode paths. They can now be formed on all areas of the discontinuous metal plane. In the present disclosure, multiple vias can be added, which produces a less inductive path. Adding more vias decreases both inductance and resistance.

Figure 2B:
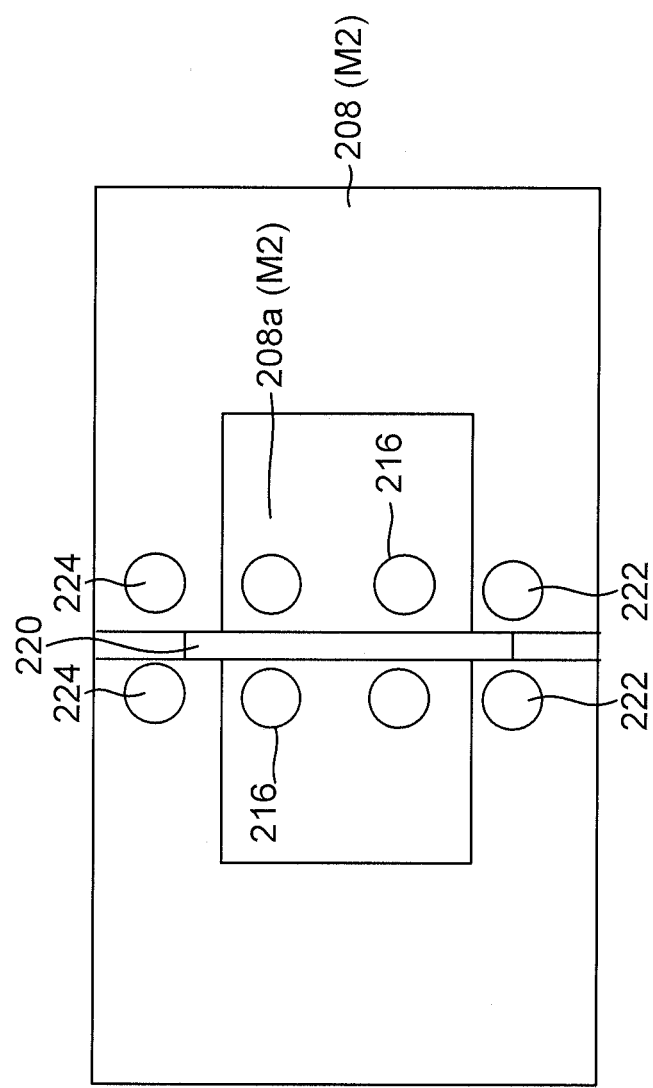
FIG. 2B is a plan view of the M2 metal layer of a package substrate having additional vias.

Referring to FIG. 2B, additional vias 222 and 224 are formed from the M1 metal layer (not shown) to the parts of the M2 metal layer 208 that are not directly on top of the capacitor or the capacitor electrode terminals (i.e., the reconstructed metal layer portions 208a). In other words, the additional vias 222 and 224 are formed onto the original, not reconstructed portions of the M2 metal layer 208. The present disclosure provides not only the ability to add more vias, but flexibility in where to put the vias.

Going back to FIG. 2A, because the M2 metal layer 208 is a reconstructed discontinuous metal plane, ground vias (e.g., via 216 or 218) can be formed from the M1 metal layer 206 to the M2 metal layer 208. This allows the M1 metal layer 206 to be used for DC current in block head switch (BHS) configurations such as in a central processing unit (CPU) and graphics processing unit (GPU) with high current demand.

Package Substrate

FIG. 3 illustrates a flip-chip package 300 in accordance with one or more embodiments. Package 300 includes an integrated circuit die 310 and a package substrate 320 such as an organic package substrate. Die 310 electrically (and mechanically) interconnects with package substrate 320 by means of solder bumps 312 as known in the flip-chip packaging arts. Alternatively bumps 312 may be replaced by copper pillars or other suitable interconnects. More generally, package 300 includes a means for conductively interconnecting die 310 to package substrate 320 such as through the use of bumps 312 (e.g., solder bumps, or copper pillars). Package substrate 320 couples to a printed circuit board 330 via solder balls 324. A capacitor 340 is embedded in package substrate 320 as discussed further herein. The capacitor 340 provides current to the die 310 (specifically, to circuits disposed in the die) on the packaging substrate 320. The capacitor 340 may also provide current for other dies stacked on the package substrate 320. The close location of the capacitor 340 to the die 310 allows current to be provided with a shorter response time than capacitors that may be located farther from the die 310. Embedding capacitors in the package substrate 320 also reduces height problems.

The capacitor 340 is embedded in the package substrate 320 and may be, according to one embodiment, a metal-insulator-metal (MIM) capacitor. A metal-insulator-metal capacitor includes an insulator layer coupled on one side with a first metal layer and on a second side with a second metal layer. Interconnects (not shown) couple the capacitor 340 to circuitry (not shown) in the die 310 through the bumps 312 to provide substantially instantaneous current when needed.

Example Methods of Manufacture

FIG. 4A through FIG. 4G illustrate manufacturing steps for forming a package substrate with an embedded capacitor with reduced mounting inductance, such as package substrate 200 of FIGS. 2A-2B. For purposes of simplicity and explanation, the M1 metal layer and M4 metal layer are not illustrated.

Figure 4A:
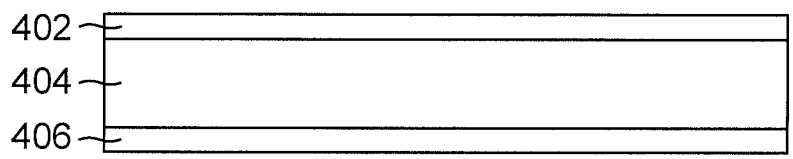
FIG. 4A is a cross-sectional view of a package substrate having metal layers and a core material.
Figure 4B:
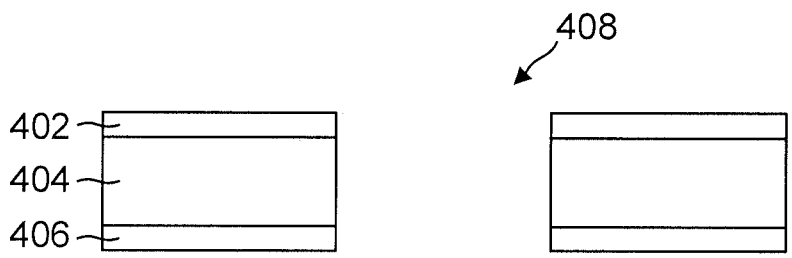
FIG. 4B is a cross-sectional view of the package substrate from FIG. 4A after forming a cavity through the metal layers and the core material.

In FIG. 4A, the package substrate starts off as a metal (e.g., copper) plated core material. As shown, the M2 metal layer 402 covers one surface of the core material 404 and an M3 metal layer 406 covers a second surface the core material 404. In FIG. 4B, a cavity or hole 408 is formed through the M2 metal layer 402, the core material 404, and the M3 metal layer 406. The cavity 408 is made large enough to place a capacitor within the cavity 408.

Figure 4C:
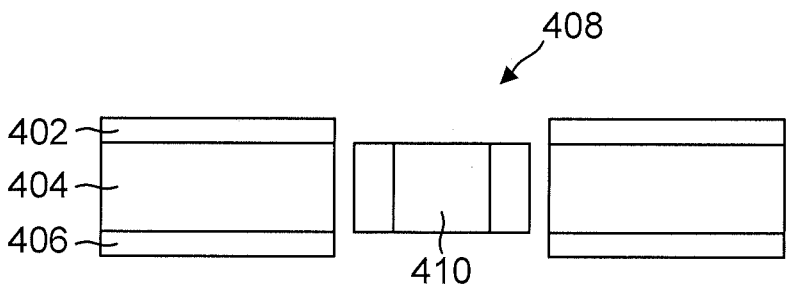
FIG. 4C is a cross-sectional view of the package substrate from FIG. 4B after insertion of a capacitor in the cavity.
Figure 4D:
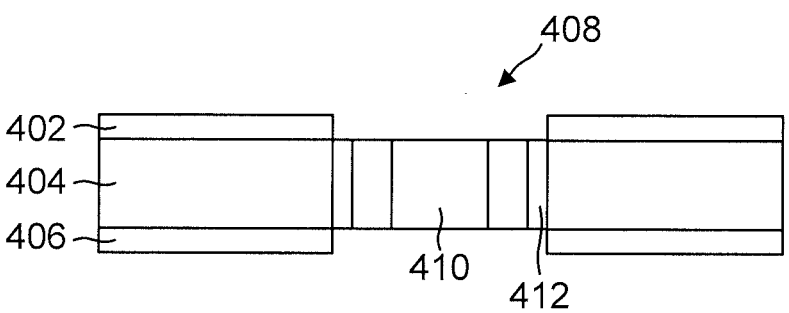
FIG. 4D is a cross-sectional view of the package substrate from FIG. 4C after filling the sides of the capacitor with a material to hold the capacitor in the cavity.

FIG. 4C illustrates the insertion of the capacitor 410 into cavity 408, with the electrodes of the capacitor 410 located on first and second sides of the capacitor 410. The capacitor 410 is positioned into the cavity 408 such that the electrodes are oriented sideways, rather than vertically. The electrodes are perpendicular to the metal layers 402, 406. FIG. 4D illustrates the filling of the sides of the cavity 408 with a material 412 (e.g., glue or resin) to hold the capacitor 410 in the cavity 408. As shown, the top and bottom surfaces of the capacitor 410 remain uncovered.

Figure 4E:
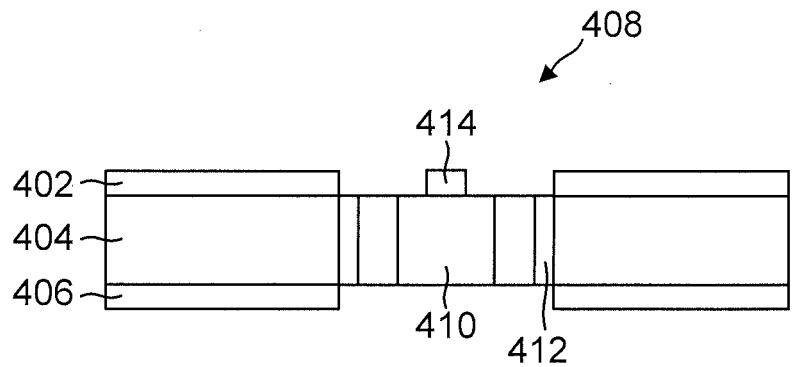
FIG. 4E is a cross-sectional view of the package substrate from FIG. 4D after deposition and patterning of a dielectric material to form a dielectric layer on the capacitor.

In FIG. 4E, a dielectric material is deposited and patterned to form a dielectric layer 414 on the capacitor 410. For example, a dielectric material is placed on one exposed surface of the capacitor 410. A photoresist is then applied on the dielectric material and patterned to serve as a mask for removal of certain portions of the dielectric material. The dielectric material is then etched through the photoresist to form dielectric layer 414. The dielectric layer 414 serves to prevent shorting between metal layers 416. Accordingly, the dielectric layer 414 also serves to prevent shorting between the electrodes of the capacitor 410. At the end of the process, (e.g., after the step shown in FIG. 4G), the dielectric material can be removed, effectively replacing the dielectric material with air. Thus, the presence of the dielectric layer 414 in the final structure is optional.

Figure 4F:
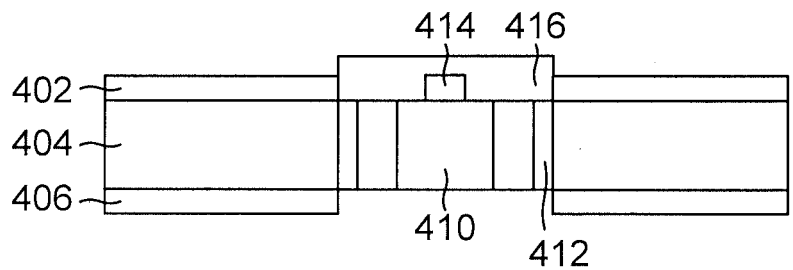
FIG. 4F is a cross-sectional view of the package substrate from FIG. 4E after formation of a metal layer over the dielectric layer.
Figure 4G:
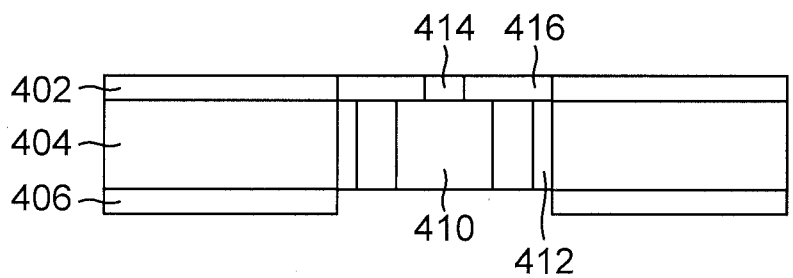
FIG. 4G is a cross-sectional view of the package substrate from FIG. 4F after the metal layer is polished back.

In FIG. 4F, a metal layer 416 (e.g., copper) is formed over the dielectric layer 414. The metal layer 416 may be the same material or a different from the M2 metal layer 402, but should be able to handle the thermal expansion and contraction required for reliable operations. As shown, the top portion of the cavity 408 is filled with a metal to allow the metal to fill the void. The metal may be filled to a level higher than then the dielectric layer 414. In FIG. 4G, the metal layer 416 is polished back or planarized, for example, by using a chemical mechanical planarization (CMP) process. The M2 metal layer 402 is thus reconstructed or rebuilt.

Method of Manufacturing Flowchart

Figure 5:
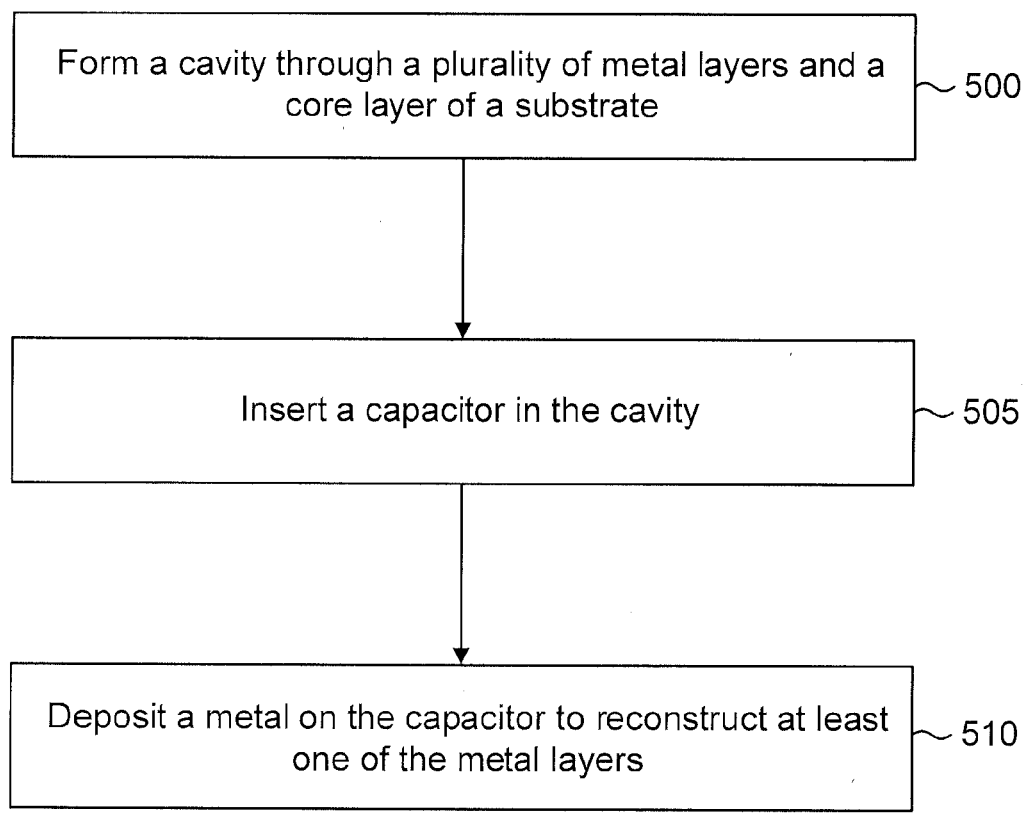
FIG. 5 is a flowchart for a method of manufacture for a package substrate with an embedded capacitor in accordance with an embodiment of the disclosure.

A manufacturing process generic to the various embodiments discussed herein may be summarized as shown in a flowchart of FIG. 5. A first step 500 comprises forming a cavity through a plurality of metal layers and a core layer of a substrate. This step is illustrated, for example, in FIG. 4B. A second step 505 comprises inserting a capacitor in the cavity of the substrate. An example of this step is shown in FIG. 4C. Finally, the process includes a step 510 of depositing a metal on the capacitor to reconstruct or rebuild at least one of the metal layers. This step is illustrated, for example, in FIGS. 4F-4G.

Example Electronic Systems

Figure 6:
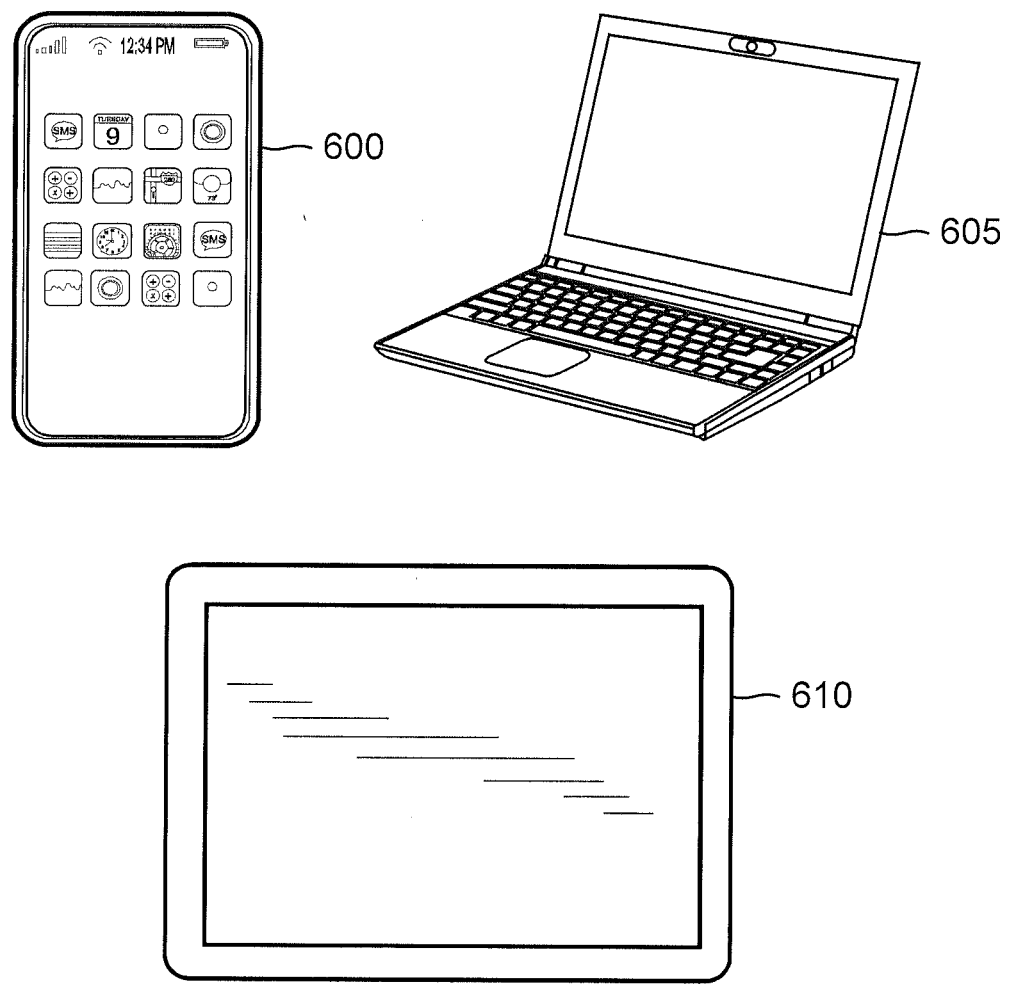
FIG. 6 illustrates some example electronic systems incorporating a package substrate in accordance with an embodiment of the disclosure.

Integrated circuit packages including an embedded capacitor as disclosed herein may be incorporated into a wide variety of electronic systems. For example, as shown in FIG. 6, a cell phone 600, a laptop 605, and a tablet PC 610 may all include an integrated circuit package incorporating a package substrate constructed in accordance with the disclosure. Other exemplary electronic systems such as a music player, a video player, a communication device, and a personal computer may also be configured with integrated circuit packages constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A package substrate, comprising:
   a substrate comprising a core layer;
   a first metal layer on the core layer, the first metal layer having a discontinuity formed at a cavity in the substrate;
   a capacitor embedded in the cavity of the substrate, the capacitor comprising first and second electrode pads, wherein portions of first metal layer are formed over the capacitor and directly contact the first and second electrode pads; and
   a dielectric layer separating the portions of the first metal layer in contact with the first and second electrode pads, the dielectric layer being substantially coplanar with the first metal layer.

2. The package substrate of claim 1, further comprising a plurality of vias that electrically connect the first metal layer to a second metal layer.

3. The package substrate of claim 2, wherein the plurality of vias are configured to reduce loop inductance.

4. The package substrate of claim 2, wherein a width between the plurality of vias is less than a width between the first and second electrode pads.

5. The package substrate of claim 2,
   wherein the portions of the first metal layer directly contacting the first and second electrode pads comprise reconstructed metal layer portions, and
   wherein the plurality of vias are not placed on the reconstructed metal layer portions.

6. The package substrate of claim 1, wherein the first metal comprises copper.

7. The package substrate of claim 1, wherein the first metal layer comprises a ground plane and/or a power plane.

8. The package substrate of claim 1, wherein the package substrate is incorporated into at least one of a cellphone, a laptop, a tablet, a music player, a communication device, a computer, and a video player.

9. A device, comprising:
   a substrate having a core layer and first and third metal layers formed on surfaces of the core layer, at least one of the first and third metal layers having a discontinuity at a cavity in the substrate;
   a capacitor embedded in the cavity in the substrate, the capacitor having first and second electrode pads in direct contact with the at least one of the first and third metal layers;
   means for coupling the capacitor to a second metal layer; and
   a dielectric layer separating portions of the first and/or the third metal layers in contact with the first and second electrode pads, the dielectric layer being substantially coplanar with the first and/or the third metal layer.

10. The device of claim 9, wherein the means comprise a via formed between the second metal layer and the first metal layer and/or formed between the second metal layer and the third metal layer.

11. A package substrate, comprising:
    a substrate comprising a core layer;
    a metal layer on a surface of the core layer, the metal layer comprising first and second metal layer portions, the first and second metal layer portions being discontinuous at a cavity in the substrate;
    a capacitor embedded in the cavity of the substrate, the capacitor comprising first and second electrode pads, the first and second electrode pads directly contacting respectively the first and second metal layer portions; and
    a dielectric layer separating the first and second metal layer portions and electrically isolating the first and second electrodes, the dielectric layer being substantially coplanar with the first and second metal layer portions.

12. The package substrate of claim 11,
    wherein the first metal layer portion comprises a first reconstructed metal layer portion and a first original metal layer portion, the first reconstructed metal layer portion directly contacting the first electrode pad of the capacitor, and
    wherein the second metal layer portion comprises a second reconstructed metal layer portion and a second original metal layer portion, the second reconstructed metal layer portion directly contacting the second electrode pad of the capacitor.

13. The package substrate of claim 12, wherein the first and second reconstructed metal layer portions vertically overlap the capacitor.

14. The package substrate of claim 12,
    wherein the metal layer is an M2 metal layer, the first metal layer portion is a first M2 metal layer portion, the first reconstructed metal layer portion is a first reconstructed M2 metal layer portion, the first original metal layer portion is a first original M2 metal layer portion, the second metal layer portion is a second M2 metal layer portion, the second reconstructed metal layer portion is a second reconstructed M2 metal layer portion, and the second original metal layer portion is a second original M2 metal layer portion, and
    wherein the package substrate further comprises:
       an M1 metal layer above the M2 metal layer, the M1 metal layer comprising first and second M1 metal layer portions respectively above the first and second M2 metal layer portions, the first and second metal M1 layer portions being discontinuous at the cavity in the substrate;
       one or more first vias electrically connecting the first reconstructed M2 metal layer portion with the first M1 metal layer portion; and
       one or more second vias electrically connecting the second reconstructed M2 metal layer portion with the second M1 metal layer portion.

15. The package substrate of claim 14, wherein a width between one of the one or more first vias and one of the one or more second vias is less than a width between the first and second electrode pads of the capacitor.

16. The package substrate of claim 14, wherein the one or more first vias comprise a plurality of first vias and/or the one or more second vias comprise a plurality of second vias.

17. The package substrate of claim 14,
    wherein each of the one or more first vias vertically overlaps the capacitor and/or the first reconstructed M2 metal layer portion, and
    wherein each of the one or more second vias vertically overlaps the capacitor and/or the second reconstructed M2 metal layer portion.

18. The package substrate of claim 14, further comprising:
    one or more first additional vias and/or one or more second additional vias,
    wherein when present, the one or more first additional vias electrically connect the first original M2 metal layer portion with the first Ml metal layer portion, and
    wherein when present, the one or more second additional vias electrically connect the second original M2 metal layer portion with the second Ml metal layer portion.

19. The package substrate of claim 18,
wherein none of the one or more first additional vias vertically overlaps the capacitor, and
wherein none of the one or more second additional vias vertically overlaps the capacitor.

20. The package substrate of claim 13, wherein neither the first original metal layer portion nor the second original metal portion vertically overlaps the capacitor.

* * * * *